U S 0 0 6 8 3 6 1 2 7 B 2

US006836127B2

(12) United States Patent
Marshall et al.

(10) Patent No.: US 6,836,127 B2
(45) Date of Patent: Dec. 28, 2004

(54) DUAL SWITCHING REFERENCE VOLTAGES

(75) Inventors: David Marshall, Fort Collins, CO (US); John E Tillema, Fort Colllins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 81 days.

(21) Appl. No.: 09/916,408

(22) Filed: Jul. 27, 2001

(65) Prior Publication Data

US 2003/0020490 A1 Jan. 30, 2003

(51) Int. Cl.[7] ........................ G01R 27/02; H04J 15/00; H03K 5/153; H04L 25/00
(52) U.S. Cl. ...................... 324/606; 324/76.59; 327/78; 375/318
(58) Field of Search .............................. 324/606, 76.59, 324/617, 76.47, 76.54, 76.55, 76.82; 375/317, 318, 330, 287, 340; 327/340, 78, 79, 74

(56) References Cited

U.S. PATENT DOCUMENTS 5,696,777 A * 12/1997 Hofsaess .................... 714/820
5,933,459 A * 8/1999 Saunders et al. ........... 375/317
6,262,602 B1 * 7/2001 Draving ....................... 327/74
6,462,558 B1 * 10/2002 Taurand ....................... 324/606

* cited by examiner

Primary Examiner—Anjan K. Deb
(74) Attorney, Agent, or Firm—Alexander J. Neudeck

(57) ABSTRACT

Two reference voltages and two differential receivers are used to detect low-to-high and high-to-low transitions on an input signal and set a received signal output. One reference voltage is set near but under the electrical high voltage level and the other is set near but above the electrical low voltage level. The reference voltage that is closest to the input signal is designated as the active reference voltage. When the input signal crosses the active reference voltage digital value of the received signal output is changed. When the input signal then crosses the inactive reference voltage, the inactive reference voltage is made the active reference voltage. A dead-time is then waited where input signal crossings of the active reference voltage are ignored. After the dead-time, input signal crossings of the active reference voltage will change the received signal output.

11 Claims, 3 Drawing Sheets

DUAL SWITCHING REFERENCE VOLTAGES

FIELD OF THE INVENTION

This invention relates generally to electronic circuits and more particularly to methods and circuits for receiving digital electronic signals.

BACKGROUND OF THE INVENTION

Digital electronic signals are used to communicate digital information. This communication may be from on device to another, one integrated circuit (or chip) to another or within an integrated circuit itself. There has been a continuing need for this communication to be faster.

SUMMARY OF THE INVENTION

Two reference voltages and two differential receivers are used to detect low-to-high and high-to-low transitions on an input signal and set a received signal output. One reference voltage is set near but under the electrical high voltage level and the other is set near but above the electrical low voltage level. The reference voltage that is closest to the input signal is designated as the active reference voltage. When the input signal crosses the active reference voltage, the digital value of the received signal output is changed. When the input signal then crosses the inactive reference voltage, the inactive reference voltage is made the active reference voltage. A dead-time is then waited where input signal crossings of the active reference voltage are ignored. After the dead-time, input signal crossings of the active reference voltage will change the received signal output.

DETAILED DESCRIPTION OF THE PREFERRED EMBODIMENTS

Figure 1:
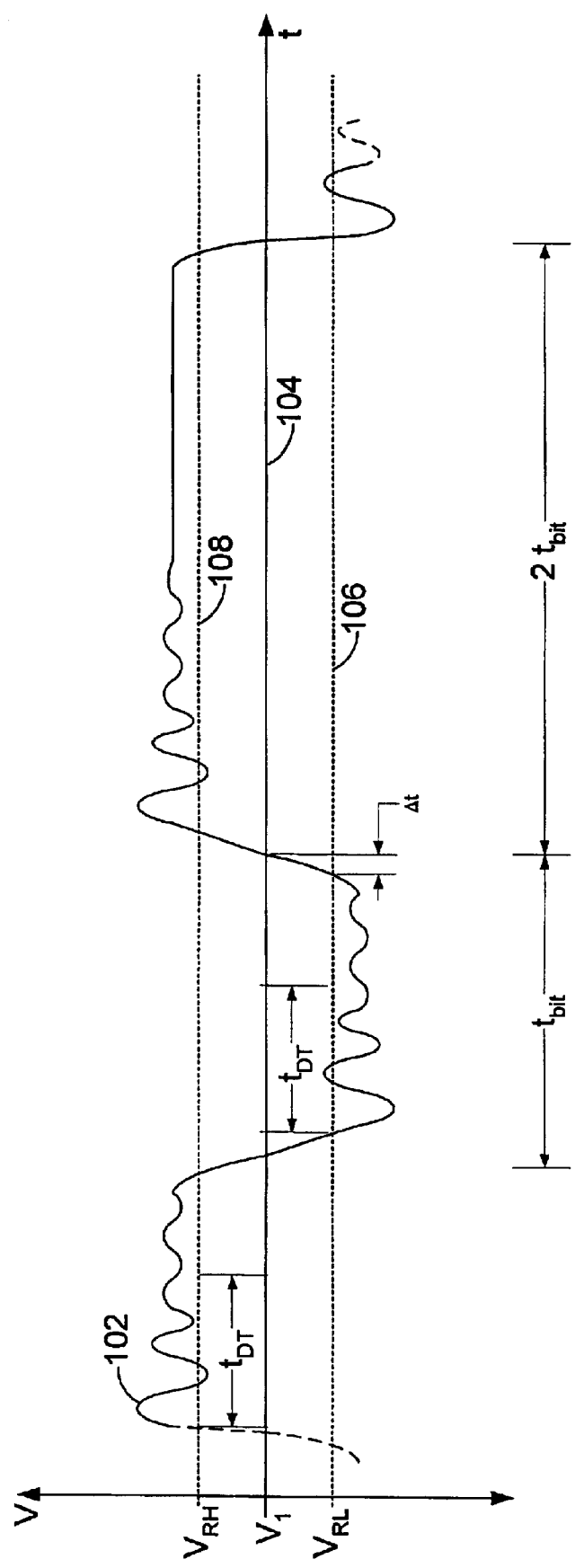
FIG. 1 is voltage vs. time plot of an exemplary input signal, dual reference voltages, and an example single reference voltage.

FIG. 1 is voltage vs. time plot of an exemplary input signal 102, dual reference voltages 106, 108, and an example single reference voltage 104. The higher of the dual reference voltages 108 is labeled as $V_{RH}$. The lower of the dual reference voltages 106 is labeled as $V_{RL}$. The example single reference voltage is labeled $V_1$.

To illustrate the use of dual reference voltages 106, 108, examine FIG. 1 starting where input signal 102 goes from a dashed line to a solid line. At this point in time, $V_{RH}$ is the active reference and $V_{RL}$ is inactive. Also, this is during dead-time $t_{DT}$ where the output is prevented from changing even though input signal 102 may cross the active reference voltage.

As shown in FIG. 1, some time after $t_{DT}$, input signal 102 transitions. This causes it to cross the active reference voltage, $V_{RH}$. Input signal 102 crossing the active reference voltage results in the output switching state. If the input signal 102 being near $V_{RH}$ is defined as being a logical "1", then input signal 102 crossing $V_{RH}$ when it is the active reference voltage results in the output being switched from a logical 1 to a logical 0.

As input signal 102 continues its transition, it eventually crosses the inactive reference voltage, $V_{RL}$. At this point in time, $V_{RL}$ is made the active reference voltage, $V_{RH}$ is made the inactive reference voltage, and another dead-time, $t_{DT}$, begins. Once again, during the dead-time, $t_{DT}$, the output is prevented from changing even though input signal 102 may cross the now active reference voltage $V_{RL}$.

After the second dead-time, input signal 102 is shown transitioning from a low voltage level (below $V_{RL}$) to a high voltage level (above $V_{RH}$). This causes it to cross the active reference voltage, $V_{RL}$. Input signal 102 crossing the active reference voltage results in the output switching state. Since the state was a logical 0, the output is now switched to a logical 1. As input signal 102 completes this transition, it crosses the inactive reference voltage, $V_{RH}$. At this point in time, $V_{RH}$ is made the active reference voltage, $V_{RL}$ is made the inactive reference voltage, and another dead-time, $t_{DT}$, begins. Once again, during the dead-time, $t_{DT}$, the output is prevented from changing even though input signal 102 may cross the now active reference voltage $V_{RH}$.

In one embodiment, the dead-time, $t_{DT}$, is approximately one-half the minimum period of the input signal. However, depending upon the characteristics of the input signal, the dead-time could be chosen from a large range of times that include as little as ¼ or less than the minimum period of the input signal to as large as the minimum period of the input signal.

To illustrate one of the advantages of dual switching reference voltages, note the time from input signal 102 crossing an active reference voltage to input signal 102 crossing the example single reference voltage. This is illustrated in one spot on FIG. 1a Δt. Since the output is switched when the input signal 102 crosses the active reference voltage with the dual switching reference voltages, and the output in an example single reference voltage only switches when the input voltage crosses the single reference voltage 104, then the time represented by Δt illustrates how much faster the dual switching reference voltages can detect changes on the input signal 102.

Figure 2:
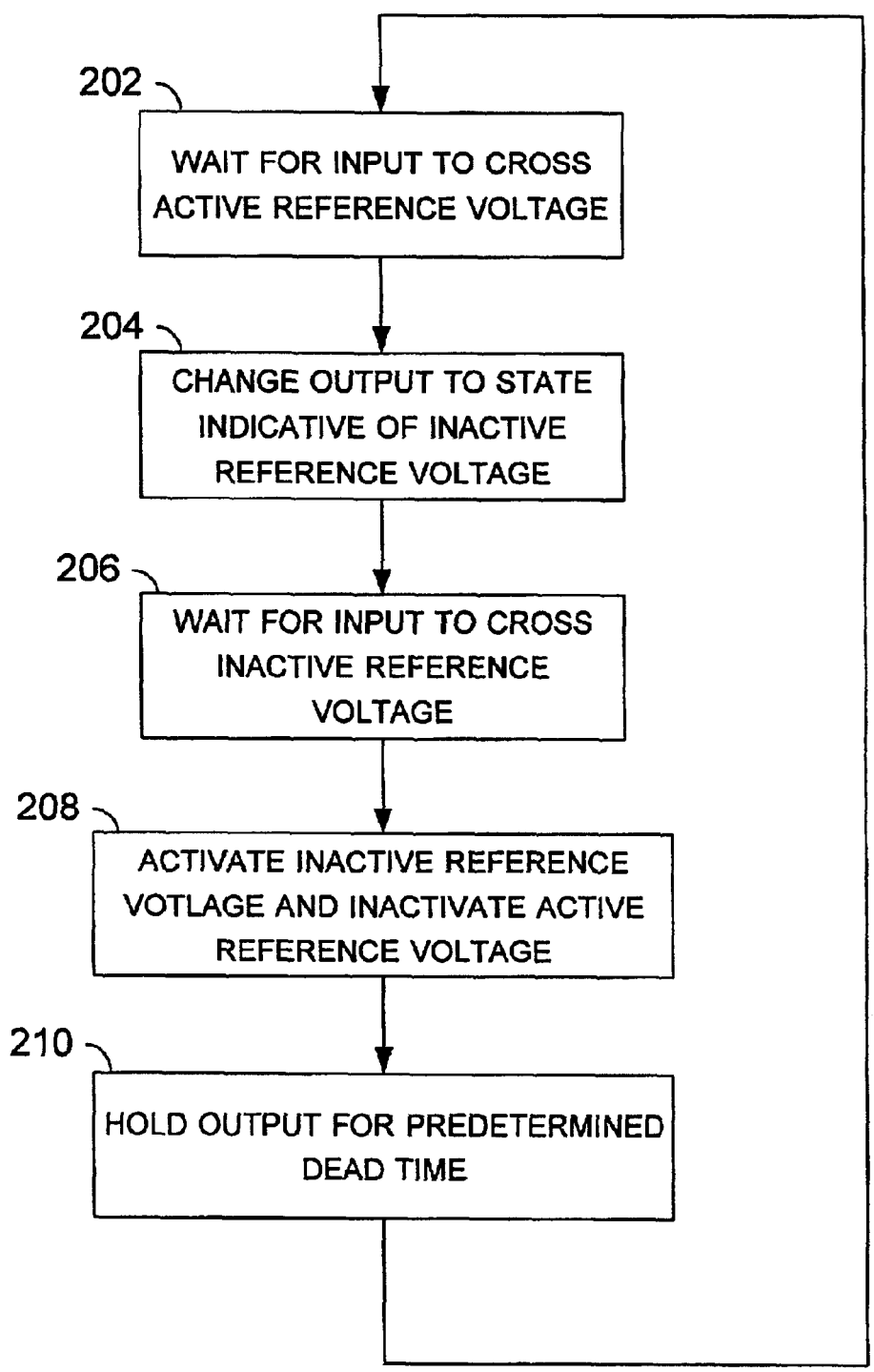
FIG. 2 is a flowchart illustrating steps to receive an input signal using dual reference voltages.

FIG. 2 is a flowchart illustrating steps to receive an input signal using dual reference voltages. In a step 202, the receiving system has an active reference voltage and an inactive reference voltage as it waits until the input crosses the active reference voltage before proceeding to step 204. In a step 204, the output of the receiving system is changed to a logic state that is indicative of the input voltage being at or near the inactive reference voltage. For example, if a first reference voltage is the active reference voltage and the input being below that first reference voltage indicates a logical zero should be output by the receiving system and a second reference voltage is the inactive reference voltage and the input being above that second reference voltage indicates a logical one should be output by the receiving system, then when the input voltage crosses the first reference voltage, the receiving system should change its output from a logical zero to a logical one. After step 204, the process continues to step 206.

In a step 206, the system waits for the input to cross the inactive reference voltage before proceeding to step 208. In a step 208, the system swaps the active and inactive reference voltages so that the previously active reference voltage is now the inactive reference voltage and the previously inactive reference voltage is now the active reference voltage. After step 208, the process continues to step 210. In a step 210, the receiving system holds its output in its current state for a predetermined dead-time. During this dead-time, crossing of the active or inactive reference voltage are ignored and have no effect upon the state of the output or which reference voltage is active and which is inactive. After the predetermined dead-time has expired, the process proceeds back to step 202.

Figure 3:
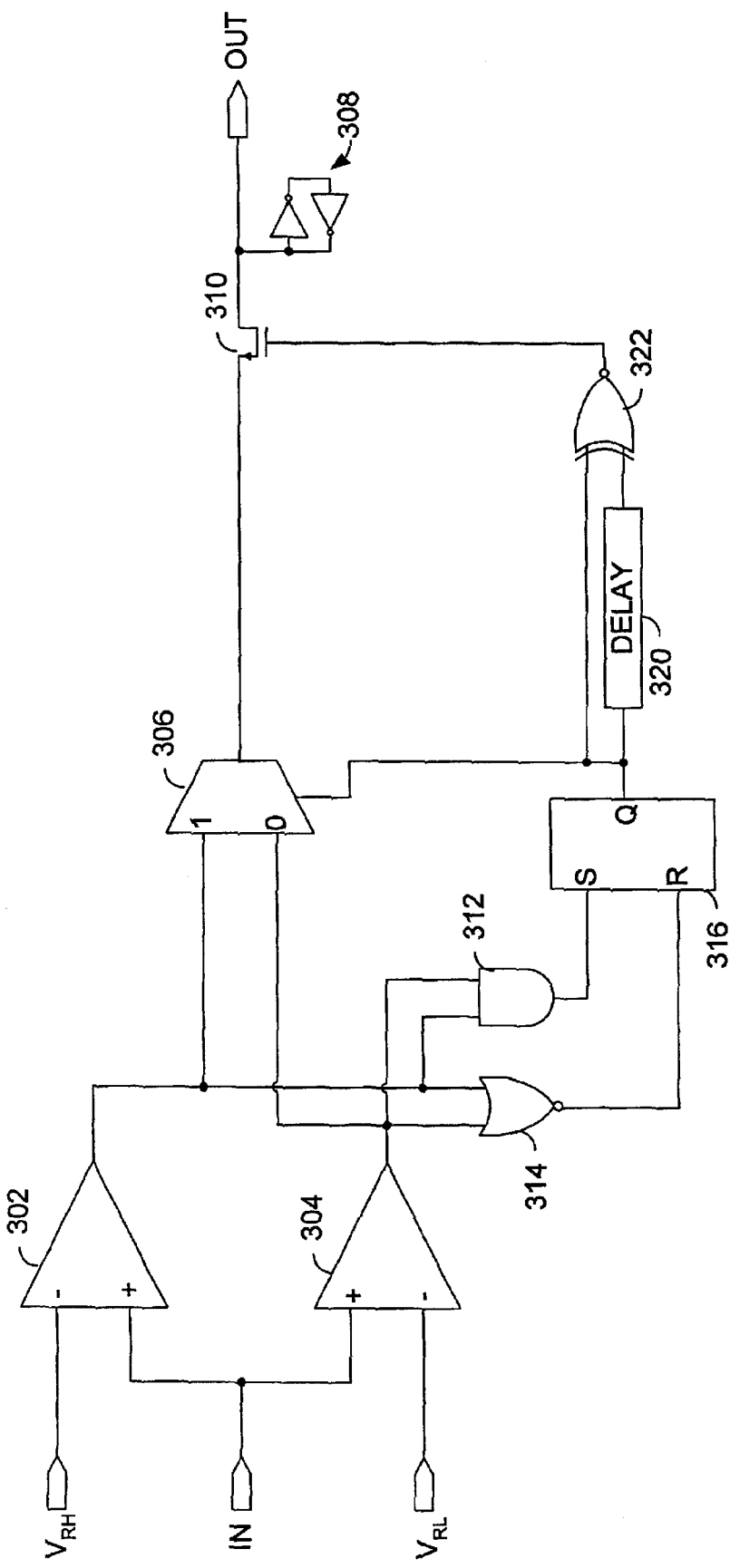
FIG. 3 is a schematic diagram illustrating a receiver circuit that utilizes dual reference voltages.

FIG. 3 is a schematic diagram illustrating a receiver circuit that utilizes dual reference voltages. In FIG. 3, input signal, IN, is connected to the non-inverting inputs of comparators 302 and 304. A first reference voltage, $V_{RL}$, is connected to the inverting input of comparator 304. A second reference voltage, $V_{RH}$, is connected to the inverting input of comparator 302.

The output of comparator 302 is connected to a first input of NOR gate 314, a first input of AND gate 312 and the "1" input of multiplexor (MUX) 306. The output of comparator 304 is connected to a second input of NOR gate 314, a second input of AND gate 312 and the "0" input of MUX 306. The "1" input of MUX 306 is the input whose state is placed on the output of the MUX when the control input is a logical "1". Likewise, the "0" input of MUX 306 is the input whose state is placed on the output of the MUX when the control input is a logical "0".

The output of AND gate 312 is connected to the SET (S) input of RS flip-flop 316. The output of NOR gate 314 is connected to the RESET (R) input of RS flip-flop 316. Accordingly, when the output of AND gate 312 goes to a logical "1" the output of RS flip-flop 316, Q, either stays, or is set to a logical "1". When the output of NOR gate 314 goes to a logical "1" the output of RS flip-flop 316, Q, either stays, or is reset to a logical "0".

The output of RS flip-flop 316, Q, is connected to the control input of MUX 306, a first input of XNOR gate 322, and the input of a delay element 320. The output of delay element 320 is a copy of the signal on the input of the delay element 320 delayed by a predetermined time delay. This may be constructed from any number of circuits and devices well known in the art including a string of inverters. The length of this predetermined time delay is a significant portion of the dead-time discussed above. The output of delay element 320 is connected to a second input of NOR gate 322. The output of XNOR gate 322 is connected to the control terminal of pass-gate 310. Pass-gate 310 is connected between the output of MUX 306 and the output of the receiver circuit, OUT, such that when control terminal of pass-gate 310 is a logical "1", the output of MUX 306 is connected to the output of the receiver circuit, OUT. Also connected to OUT is one node of two cross-coupled inverters 308. These cross-coupled inverters act to hold the last value passed through pass-gate 310 when pass-gate 310 is not on (i.e. when the control terminal of pass gate 310 is a logical "0".)

To illustrate the functioning of the receiver circuit shown in FIG. 3, assume that the input signal, IN is lower than both the first and second reference voltages, $V_{RL}$ and $V_{RH}$, that $V_{RL}$ is the active reference voltage, that $V_{RL}$ is lower than $V_{RH}$, and that the dead-time has expired. This would mean that the output of RS flip-flop 316 is a logical "0" (indicating that $V_{RL}$ is the active reference voltage) and the output of XNOR 322 is a logical "1" (indicating that the dead-time has expired.) Since the output of RS flip-flop 316 is a logical "0", MUX 306 is outputting the value on its "0" input which is the output of comparator 304 (which is a logical "0"). The output of MUX 306 is also being passed to the output of the receiver, OUT, since the output of XNOR 322 is controlling pass-gate 310 to be on. The receiver will remain in this state until the input signal, IN, crosses the active reference voltage, $V_{RL}$.

When the input signal, IN, crosses the active reference voltage, $V_{RL}$, the output of comparator 304 changes from a logical "0" to a logical "1". This change passes through MUX 306, pass-gate 310 to the output of the receiver, OUT. The receiver will remain in this state until the input signal, IN, crosses the inactive reference voltage.

When the input signal, IN, crosses the inactive reference voltage, $V_{RH}$, the output of comparator 302 changes from a logical "0" to a logical "1". With the output of comparator 304 already at a logical "1", this change means both inputs to AND gate 312 are now logical "1's" so the output of AND gate 312 changes from a logical "0" to a logical "1". This sets the output of RS flip-flop, Q, to a logical "1". The change in the output of RS flip-flop 316 changes the input being selected by MUX 306 from its "0" input to its "1" input. This indicates that $V_{RH}$ is now the active reference voltage and $V_{RL}$ is now the inactive reference voltage.

The change in the output of RS flip-flop 316 also causes the output of XNOR gate 322 to go to a logical "0" for approximately the delay time of time delay 320. While the output of XNOR gate 322 is at a logical "0", pass-gate 310 is off so changes on the output of comparator 302 as selected by MUX 306 won't be reflected on the output of the receiver. After approximately the delay time of time delay 320, the output of XNOR gate 322 changes back to a logical "1" and changes on the output of comparator 302 due to the input voltage crossing the active reference voltage will be reflected on the receiver output, OUT. A similar process occurs as the input voltage falls crossing $V_{RH}$ then $V_{RL}$ with the output of the receiver changing to a logical "0" and then $V_{RL}$ being made the active reference voltage.

Although several specific embodiments of the invention have been described and illustrated, the invention is no to be limited to the specific forms or arrangements of parts so described and illustrated. The invention is limited only by the claims.

What is claimed is:

1. A method of receiving a signal, comprising:

comparing an input voltage to a first reference voltage;

comparing said input voltage to a second reference voltage, wherein either said first reference voltage or said second reference voltage is active;

selecting an output voltage based on said the difference between said input voltage and the active reference voltage of either said first reference voltage or said second reference voltage;

changing said output voltage when said input voltage crosses said activated reference voltage; and changing the activated reference voltage when said input crosses said activated voltage.

2. The method of claim 1, further comprising:

holding said output voltage for a period of time without regard to said in put voltage crossing said activated reference voltage.

3. An apparatus, comprising:

a first comparator that compares a first reference voltage to an input signal, said first comparator comprising a first comparator output;

a second comparator that compares a second reference voltage to said input signal, said second comparator comprising a second comparator output;

a selector comprising at least one selector input, a selector output, and a selector control, said at least one selector input being connected to said first comparator output and said second comparator output, said selector passing the voltage of one of said first comparator output and said second comparator output to an output of said apparatus via said selector output depending upon which of said first reference voltage and said second reference voltage is activated; and an activator/deactivator comprising at least one input and at least one output, said at least one input being operatively connected to said first comparator output and said second comparator output, said at least one output being operatively connected to said selector control, said activator/deactivator controlling said selector depending upon the state of said first output and said second output.

4. The apparatus of claim 3, comprising a holder that prevents said receiver output from changing for a period of time after a change in which either one of said first reference voltage or said second reference voltage is activated and the other reference voltage is deactivated.

5. The apparatus of claim 4, wherein said holder comprises a delay circuit.

6. The apparatus of claim 4, wherein said holder comprises a at least two inverters, wherein an input of a first inverter is connected to the output of a second inverter and the output of said first inverter is connected to the input of said second inverter.

7. The apparatus of claim 3, wherein said selector is a multiplexor.

8. The apparatus of claim 3, wherein said activator/deactivator is a flip-flop circuit.

9. An electronic circuit comprising:

a first comparator comprising a first comparator first input, a first comparator second input, and a first comparator output, said first comparator first input being connectable to an input voltage, said first comparator second input being connected to a first reference voltage;

a second comparator comprising a second comparator first input, a second comparator second input, and a second comparator output, said second comparator first input being connectable to an input voltage, said second comparator second input being connected to a second reference voltage, said second reference voltage being less that said first reference voltage;

an AND gate, wherein a first input of said AND gate is connected to said first comparator output and a second input of said AND gate is connected to said second comparator output;

a NOR gate, wherein a first input of said NOR gate is connected to said first comparator output and a second input of said NOR gate is connected to said second comparator output;

a flip-flop circuit comprising a flip-flop first input that is connected to the output said AND gate, a flip-flop second Input that is connected to the output of said NOR bate, and a flip-flop output; and a multiplexor comprising a multiplexor first input that is connected to said first comparator output, a multiplexor second input that is connected to said second comparator output, a multiplexor control that is connected to said flip-flop output, and a multiplexor output that is the output of said electronic circuit.

10. The electronic circuit of claim 9 and further comprising:

a delay circuit, where an input of said delay circuit is connected to said flip-flop output;

an exclusive NOR gate, wherein a first input of said exclusive NOR gate is connected to said flip-flop output and wherein a second input or said exclusive NOR gate is connected to an output of said delay circuit; and a switch comprising a switch input, a switch output, and a switch control, said switch input being connected to said multiplexor output, said switch output being the output of said electronic circuit, said switch control being connected to the output of said exclusive NOR gate.

11. The electronic circuit of claim 9 and further comprising a holding circuit operatively connected to said switch output.

* * * * *